United States Patent [19]

Mackamul et al.

[11] Patent Number: 4,584,427
[45] Date of Patent: Apr. 22, 1986

[54] THIN FILM SOLAR CELL WITH FREE TIN OF TIN OXIDE TRANSPARENT CONDUCTOR

[75] Inventors: Kevin K. Mackamul, Simi Valley; Don L. Morel, Agoura Hills; David P. Tanner, Thousand Oaks, all of Calif.

[73] Assignee: Atlantic Richfield Company, Los Angeles, Calif.

[21] Appl. No.: 663,648

[22] Filed: Oct. 22, 1984

[51] Int. Cl.4 ..................... H01L 31/06; H01L 31/18
[52] U.S. Cl. ..................................... 136/256; 29/572; 29/590; 136/258; 357/30; 357/71; 427/39
[58] Field of Search ............... 136/256, 258 AM; 357/30, 71; 427/39, 74, 88; 29/572, 590

[56] References Cited

U.S. PATENT DOCUMENTS

| | | | |
|---|---|---|---|
| 3,941,672 | 3/1976 | Tanaka et al. | 204/192 |
| 4,330,182 | 5/1982 | Coleman et al. | 357/2 |
| 4,385,200 | 5/1983 | Hamakawa et al. | 136/258 AM |
| 4,387,387 | 6/1983 | Yamazaki | 357/30 |
| 4,388,482 | 6/1983 | Hamakawa et al. | 136/258 AM |
| 4,410,559 | 10/1983 | Hamakawa et al. | 427/39 |

FOREIGN PATENT DOCUMENTS

| | | | |
|---|---|---|---|
| 0025872 | 8/1980 | European Pat. Off. | 136/258 AM |
| 56-114384 | 9/1981 | Japan | 136/258 AM |
| 58-78473 | 5/1983 | Japan | 136/258 AM |
| 58-92281 | 6/1983 | Japan | 136/258 AM |

OTHER PUBLICATIONS

*Xerox Disclosure Journal*, vol. 7, No. 5 (1982), p. 299.
*J. Appl. Phys.*, vol. 52 (1981), pp. 3073-3075.

Primary Examiner—Aaron Weisstuch
Attorney, Agent, or Firm—Albert C. Metrailer

[57] ABSTRACT

A thin film solar cell structure having a free metal layer between a transparent conductor front face contact and the front face surface of the actual thin film photovoltaic device. The free metal, preferably tin, may be formed by glow discharge reduction of the transparent conductor surface or by direct deposition of free metal.

13 Claims, 1 Drawing Figure

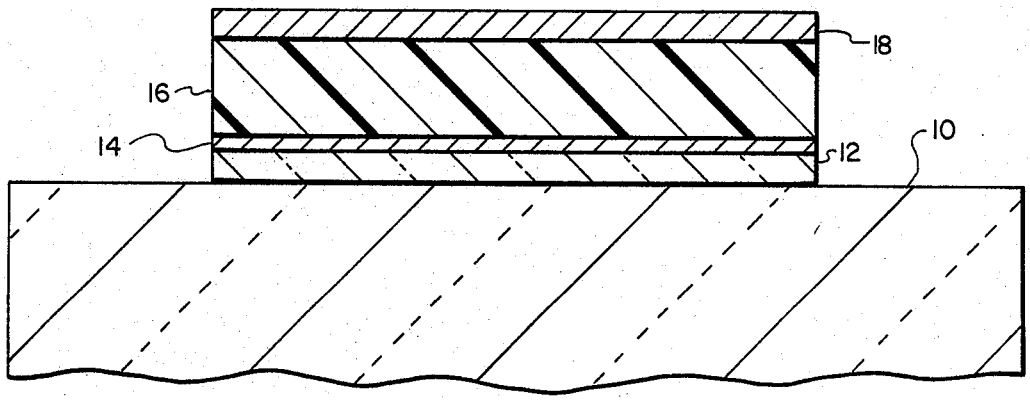

THIN FILM SOLAR CELL WITH FREE TIN ON TIN OXIDE TRANSPARENT CONDUCTOR

BACKGROUND OF THE INVENTION

This invention relates to thin film solar cells and more particularly to such solar cells having a layer of free metal between the transparent conductive layer and the semiconductor layer.

The art of thin film solar cells is well-known and improvements are being made therein in an effort to make such devices commercially practical. For example, amorphous silicon p-i-n structures are disclosed in U.S. Pat. Nos. 4,385,200 and 4,388,482 issued to Hamakawa on May 24, 1983 and June 14, 1983, respectively. Another Hamakawa et al patent, U.S. Pat. No. 4,410,559 issued Oct. 18, 1983, provides more detailed teachings concerning the glow discharge techniques for depositing amorphous silicon films with various doping materials. Each of these patents is hereby incorporated by reference for their teachings of cell structures and methods of manufacture.

While the amorphous silicon solar cells seem quite simple, the continued development has identified numerous limiting factors in such cells. The above-referenced patents discuss various ways of improving overall cell efficiency. As indicated in those patents, a somewhat typical solar cell comprises a transparent substrate such as glass supporting a transparent conductor layer on which is deposited the amorphous silicon active device on which is deposited a back face, usually metallic, conductor. Current is carried from the device by means of the front transparent conductor and the back metallic conductor. It has long been recognized that improvements in conductor resistivity, particularly the transparent conductor, can reduce device internal resistance and thereby improve efficiency. The ability to maintain peak current output near the maximum operating voltage is commonly referred to as the cell fill factor, CFF, with the higher rating being preferable. Internal resistances of the various conducting layers and interfaces therebetween must be reduced to improve the CFF.

SUMMARY OF THE INVENTION

According to the present invention, we have discovered that presence of the free metal between the transparent conductive layer and the semiconductor layer improves measured cell fill factor. We have also discovered that free metal may be efficiently formed on the transparent conductive layer using the same glow discharge apparatus with which the semiconductor layer is deposited.

BRIEF DESCRIPTION OF THE DRAWING

The present invention may be better understood by reading the following detailed description of the preferred embodiments with reference to the accompanying single FIGURE which is a cross-sectional illustration of a thin film solar cell according to the present invention.

DESCRIPTION OF THE PREFERRED EMBODIMENTS

With reference now to the FIGURE there is illustrated a basic solar cell structure according to the present invention. In this embodiment the solar cell is formed on a transparent insulating substrate 10. In the preferred embodiment, this substrate 10 is relatively inexpensive soda lime glass having a thickness of about one millimeter. A transparent conductor, TC, layer 12 is deposited on substrate 10 to form a front face contact for the finished device. Layer 12 is typically 4000 to 5000 angstroms thick and is formed primarily from tin oxide, but may be doped with materials such as indium or fluorine as is well known in the art.

A free metal layer 14 is formed or deposited upon TC layer 12. In the preferred embodiments, layer 14 is tin which is either directly deposited by, for example, sputtering or is discharge apparatus. Layer 14 has a thickness of about ten to one-hundred angstroms and preferably of about ten to fifty angstroms and is greatly exaggerated in the drawing for purposes of illustration only. It is apparent that layer 14 must be sufficiently thin so as not to significantly interfere with transmission of light received through substrate 10.

As used herein, the terms free metal or free tin refer to the elemental form of the metal or tin free of any oxygen bonds. It does not necessarily mean that in the finished solar cell device a continuous layer of metal or tin exists in which the metal or tin atoms are bound extensively to each other. Instead it is likely that the free metal is actually incorporated into the structure of the first portion of the silicon layer 16 described below.

A photovoltaic semiconductor structure 16 is formed on conductor layer 14. In the preferred embodiment, structure 16 is a P-I-N amorphous silicon photovoltaic cell such as those taught in the above-referenced Hamakawa et al patents and would have a thickness of from about 5000 to 7000 angstroms overall. The individual P, I, and N layers are not separately illustrated in the FIGURE in order to simplify the drawing.

The solar cell is completed by providing a back electrical contact 18 on the semiconductor structure 16. In the preferred embodiment, layer 18 is formed from aluminum and is deposited to a thickness of about 2000 angstroms. Layer 18 may of course be formed from other conductive materials including transparent conductors such as are typically used for layer 12.

As noted above, reduction in internal device resistance in order to improve CFF has been a goal of much thin film solar cell research and development. The use of the free metal layer 14 according to the present invention has been found to significantly improve CFF. We believe this improvement is due to a reduction in resistance at the interface between the TC layer 12 and the semiconductor structure 16. The free metal which is preferably tin, when layer 12 is formed primarily from tin oxide, appears to make a good electrical contact to layer 12. Upon glow discharge deposition of the semiconductor 16 the free metal 14 is believed to alloy with the first portion of deposited semiconductor thereby forming a good electrical contact to the semiconductor 16. The net effect is believed to be a low resistance contact between layers 12 and 16 which results in the net improvement in cell performance in terms of CFF.

The preferred method of forming free metal layer 14 is performed in the same glow discharge apparatus which is used to deposit semiconductor layer 16. For example glow discharge apparatus such as that taught in the above-referenced U.S. Pat. No. 4,410,559 would be suitable for this purpose. We have found that a free metal layer 14 may be formed on a TC layer 12 by exposing the TC layer to such a glow discharge in which a flow of hydrogen gas is provided. For example, about 30 angstroms of free tin may be formed on a tin oxide TC layer 12 by glow discharge treatment under the following conditions; hydrogen flowing at 100 standard cubic centimeters per minute, pressure of 1.5 torr, 30 watts of 13.56 MHz applied to 215 square inches of surface for six seconds.

The above process was discovered when hydrogen glow discharge was used with the intent of cleaning TC coated substrates prior to deposition of silicon. When unexpected improvements in CFF resulted from such cleaning steps, we realized that free metal was being generated and was responsible for the improved performance. In order to prove the presence of free metal as a result of the hydrogen glow discharge, sample devices were produced with free tin directly deposited upon a TC layer 12. For example, a TC coated substrate was placed in a sputtering chamber and a tin target was used to deposit a free tin layer having a thickness of about 30 angstroms. This substrate was then moved to a glow discharge chamber wherein an amorphous silicon p-i-n structure was deposited. The device was then completed by deposition of an aluminum back contact 18. Upon testing, it was found that the cell fill factor was improved by the presence of the free tin. For example, the CFF of cells having the sputtered tin layer were about 0.73. Cells which did not have tin applied, either by sputtering or hydrogen glow discharge, but which were otherwise identical had CFF's of about 0.64.

While the effect of the free tin on the TC layer 12 was illustrated by direct deposition of tin or a TC layer, it is believed that the glow discharge technique for production of the free metal layer is preferred. The glow discharge equipment is typically automated so that the multiple silicon layers are deposited in an essentially continuous fashion without removing the substrate from the chamber. The generation of free metal layer 14 can be done as a first step of the glow discharge process without requiring any physical movement of the substrate. In addition to the obvious labor savings of this process, the chance of substrate contamination during movement of the substrate from an evaporation chamber to the glow discharge chamber is eliminated.

Examples of results obtained by using such a process are given in Table 1. The hydrogen glow conditions were the same as those specified above except that the time was varied to determine the effect on cell parameters. While CFF was significantly improved at processing times from 0.1 to five minutes, cell efficiency was reduced as processing time was increased beyond 0.1 minute. Thus it appears that free tin in excess of the initial effective amount merely reduces light transmission through TC layer 12.

TABLE 1

| time of H$_2$ glow minutes | Voc mv | Jsc ma/cm$^2$ | CFF % | Efficiency % |
| --- | --- | --- | --- | --- |
| 0 | 843 | 13.4 | .64 | 7.2% |
| 5 | 846 | 10.4 | .72 | 6.4% |
| 1 | 859 | 11.0 | .73 | 6.9% |
| 0.25 | 865 | 12.0 | .74 | 7.7% |
| 0.1 | 867 | 13.3 | .73 | 8.4% |

As indicated by Table 1 it appears that a hydrogen glow processing time of about 0.1 minute is preferred. However, such a short processing time may be too difficult to control to achieve uniform and reproducible results in a production situation. We have developed other glow discharge processes which generate free tin from TC layer 12 at a somewhat slower rate and therefore should be more easily controlled. One method is to use the hydrogen glow discharge process described above after an initial portion of the silicon layer 16 is deposited. This can conveniently be done after deposition of the P doped portion of layer 16, which portion is about 100 angstroms thick. This silicon layer masks the TC layer 12 or otherwise slows the reproduction process, but does not stop it completely. Results equivalent to the 0.1 minute processing time of Table 1 are achieved with a glow discharge time of five minutes. use a nonreactive gas. The structure of the TC layer 12 surface is such that bombardment by essentially any gas will selectively remove oxygen, thereby producing free tin. A glow discharge process like that described above, but in which argon was substituted for hydrogen, gave the same improved results if longer processing time was used. Thus exposure of a tin oxide TC layer 12 to an argon glow discharge for one minute produces cell improvements corresponding to the direct sputtering of 30 angstroms of free tin onto layer 12.

While the effect of the free metal was proven by deposition of pure tin on the TC layer, it is apparent that other metallic elements may be present in the free metal layer 14. Thus, TC layer 12 may contain indium and other materials. When the metal layer 14 is formed by glow discharge reduction, it can be expected that some free metallic components other than tin will also be generated.

While the present invention has been illustrated and described with reference to a particular structure and methods of manufacture thereof, it is apparent that various modifications and additions can be made thereto within the scope of the present invention as defined by the appended claims.

What is claimed is:

1. A solar cell comprising:
   a transparent front face electrode comprising oxides of one or more metals,
   a layer of free metal on said front face electrode, said free metal layer comprising at least one of said one or more metals, said layer of free metal being substantially transparent to visible light,
   a thin film photovoltaic device on said free metal layer, and
   a back face electrode on said photovoltaic device.

2. A solar cell according to claim 1 wherein said transparent front face electrode is supported on a transparent insulating substrate through which incident light may be received.

3. A solar cell according to claim 1 wherein said transparent front face electrode comprises tin oxide.

4. A solar cell according to claim 1 wherein said layer of free metal has a thickness of from 10 to 100 angstroms.

5. In the method for manufacturing a thin film photovoltaic cell wherein a substrate having a transparent conductive layer of primarily tin oxide is positioned in a glow discharge chamber and semiconductor layers are deposited on said transparent conductive layer, the improvement comprising:
   before deposition of said semiconductor layers, treating said transparent conductive layer with a glow discharge atmosphere for a time sufficient to generate an essentially transparent layer of free tin on the surface of said transparent conductive layer.

6. The improved method of claim 5 wherein said glow discharge atmosphere includes hydrogen gas.

7. The improvement method of claim 5 wherein said glow discharge atmosphere includes only nonreactive gases.

8. The improvement method of claim 7 wherein said glow discharge atmosphere comprises argon gas.

9. In the method for manufacturing a thin film photovoltaic cell wherein a substrate having a transparent conductive layer of primarily tin oxide is positioned in a glow discharge chamber and semiconductor layers are deposited on said transparent conductive layer, the improvement comprising:

after deposition of a first semiconductor layer, treating said substrate with a glow discharge including hydrogen gas for a time sufficient to generate an essentially transparent layer of free tin at the interface of said transparent conductive layer and said first semiconductor layer.

10. A solar cell comprising:

a transparent front face electrode comprising oxides of one or more metals, a layer of free metal on said front face electrode, said free metal layer formed by reduction of a portion of said front face electrode, said layer of free metal being substantially transparent to visible light, a thin film photovoltaic device on said free metal layer, and a back face electrode on said photovoltaic device.

11. A solar cell according to claim 10 wherein said transparent front face electrode is supported on a transparent insulating substrate through which incident light may be received.

12. A solar cell according to claim 10 wherein said transparent front face electrode comprises tin oxide.

13. A solar cell according to claim 10 wherein said layer of free metal has a thickness of from 10 to 100 angstroms.

* * * * *

UNITED STATES PATENT AND TRADEMARK OFFICE
CERTIFICATE OF CORRECTION

PATENT NO. : 4,584,427
DATED : April 22, 1986
INVENTOR(S) : Kevin K. Mackamul, Don L. Morel, David P. Tanner It is certified that error appears in the above-identified patent and that said Letters Patent is hereby corrected as shown below:

In the title of the Patent the word "OF" should be replaced with --ON--.

In Column 2, line 12, after the words "or is" insert --formed by reduction of a portion of the TC layer 12 in a glow--.

In Column 4, line 8, the word "reproduction" should be replaced with --reduction--.

In Column 4, line 12 should be the beginning of a new paragraph and before the word "use" insert --Another approach to the glow discharge process is to--

Signed and Sealed this

Twenty-ninth Day of July 1986

[SEAL]

Attest:

DONALD J. QUIGG

Attesting Officer    Commissioner of Patents and Trademarks